United States Patent
He et al.

(10) Patent No.: US 10,290,641 B1
(45) Date of Patent: May 14, 2019

(54) SEMICONDUCTOR DEVICE

(71) Applicant: United Microelectronics Corp., Hsinchu (TW)

(72) Inventors: Wan-Xun He, Singapore (SG); Su Xing, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/871,920

(22) Filed: Jan. 15, 2018

(30) Foreign Application Priority Data

Dec. 8, 2017 (CN) .......................... 2017 1 1294348

(51) Int. Cl.
| | |
|---|---|
| *H01L 27/11* | (2006.01) |
| *H01L 23/528* | (2006.01) |
| *H01L 27/02* | (2006.01) |
| H01L 27/092 | (2006.01) |
| H01L 27/12 | (2006.01) |

(52) U.S. Cl.
CPC ...... *H01L 27/1104* (2013.01); *H01L 23/5283* (2013.01); *H01L 27/0207* (2013.01); *H01L 27/092* (2013.01); *H01L 27/1203* (2013.01)

(58) Field of Classification Search
CPC ............ H01L 27/1104; H01L 23/5283; H01L 27/0207; H01L 27/092; H01L 27/1203
See application file for complete search history.

(56) References Cited

U.S. PATENT DOCUMENTS

| | | |
|---|---|---|
| 5,046,044 A | 9/1991 | Houston et al. |
| 8,009,563 B2 | 8/2011 | McDaniel et al. |
| 2003/0067819 A1* | 4/2003 | Satomi ................ H01L 27/1104 365/200 |
| 2005/0012161 A1* | 1/2005 | Sato ......................... G11C 8/16 257/393 |
| 2009/0146188 A1* | 6/2009 | Yamazaki ......... H01L 21/26586 257/202 |
| 2010/0207213 A1* | 8/2010 | Tan ....................... H01L 21/743 257/347 |

* cited by examiner

*Primary Examiner* — Fernando L Toledo
*Assistant Examiner* — Neil R Prasad
(74) *Attorney, Agent, or Firm* — J.C. Patents

(57) ABSTRACT

A semiconductor device has a 6T SRAM cell formed on a substrate. The SRAM cell includes a first and a second PMOS transistors formed over an N-well line in a substrate. A first and a second NMOS transistors are formed over a first P-well line in the substrate at a first side of the N-well line. A third and a fourth NMOS transistors are formed over a second P-well line in the substrate at a second side of the N-well line. A first gate line connects gates of the first PMOS transistor and the first NMOS transistor. A second gate line connects a gate of the second NMOS transistor. A third gate line connects gates of the second PMOS transistor and the third NMOS transistor. A fourth gate line connects a gate of the fourth NMOS transistor. The first gate line and the third gate line are in L-shape.

21 Claims, 4 Drawing Sheets

US 10,290,641 B1

SEMICONDUCTOR DEVICE

CROSS-REFERENCE TO RELATED APPLICATION

This application claims the priority benefit of China application serial no. 201711294348.6, filed on Dec. 8, 2017. The entirety of the above-mentioned patent application is hereby incorporated by reference herein and made a part of this specification.

BACKGROUND

1. Field of the Invention

The present invention generally relates to technology about semiconductor device, and particularly to the technology about static random access memory (SRAM).

2. Description of Related Art

The invention is directed to the semiconductor structure of SRAM device, which is a memory cell based on the structure of 6 transistor (6T). The memory cell includes two P-type meta-oxide-semiconductor (MOS), PMOS, transistors and four N-type meta-oxide-semiconductor, NMOS, transistors. These MOS transistor can be directly formed on a silicon substrate. In a further technology development, it can be fabricated by use of silicon on insulator (SOI) substrate. In semiconductor fabrication, multiple P-well lines and multiple N-well lines in a long line shape and are formed by interleaving in the substrate. The two PMOS transistor are formed over the N-well line. The four PMOS transistors are grouped into two groups, respectively formed over P-well lines located at both sides of the N-well line.

To the SOI substrate, the well lines are formed in the top silicon. A substrate voltage is applied to the whole well line from an end terminal. The transistors at the far end would rather possibly accumulate the charges, which cause decrease of the threshold voltage (Vt). As a result, it causes the issues such as instability or leakage current.

Therefore, the design for the 6T SRAM structure is still under development, so to improve the performance of the SRAM.

SUMMARY OF THE INVENTION

The invention provides the memory cell structure of 6T SRAM and can at least reduce the charge accumulation for the transistors at the edge region of the cell array, and then the transistors at the edge region can maintain the normal performance.

In an embodiment, the invention provides a semiconductor device, having a 6-transistor (6T) static random access memory (SRAM) cell formed on a substrate. The SRAM cell comprises a first and a second P-type metal-oxide-semiconductor (MOS) transistors, formed over an N-well line in a substrate. Further, a first and a second N-type MOS transistors are formed over a first P-well line in the substrate at a first side of the N-well line. A third and a fourth N-type MOS transistors are formed over a second P-well line in the substrate at a second side of the N-well line. A first gate line is connecting gates of the first P-type MOS transistor and the first N-type MOS transistor. A second gate line is connecting a gate of the second N-type MOS transistor. A third gate line is connecting gates of the second P-type MOS transistor and the third N-type MOS transistor. A fourth gate line is connecting a gate of the fourth NMOS transistor, wherein the first gate line and the third gate line are in L-like shape.

In an embodiment, as to the SRAM cell, the first gate line, the second gate line, the third gate line, and the fourth gate line over the substrate form a rectangle.

In an embodiment, as to the SRAM cell, the second gate line and the fourth gate line are L-like shape or line shape.

In an embodiment, as to the SRAM cell, the substrate is silicon substrate.

In an embodiment, as to the SRAM cell, the substrate is a silicon on insulator (SOI) substrate, comprising a top silicon layer for forming the N-well line, the first P-well line and the second P-well line.

In an embodiment, as to the SRAM cell, the first P-type MOS transistor and the first N-type MOS transistor form a first inverter, and the second P-type MOS transistor and the third N-type MOS transistor form a second inverter.

In an embodiment, as to the SRAM cell, the second N-type MOS transistor and the fourth N-type MOS serve as switch devices.

In an embodiment, as to the SRAM cell, a plurality of the SRAM cells are formed along the N-well line, the first P-well line, and the second P-well line.

In an embodiment, as to the SRAM cell, a plurality of the N-well lines, a plurality of the first P-well lines, and a plurality of the second P-well lines are extending in parallel, to form a SRAM cell array.

In an embodiment, as to the SRAM cell, it further comprises a gate insulating layer at least between the first to the fourth gate lines and the substrate respectively within the first and the second P-type MOS transistors and the first to the fourth N-type MOS transistors.

In an embodiment, as to the SRAM cell, it further comprises a first and a second heavily P-type doped regions in the substrate respectively along outsides of bended portions of the first and the third gate lines, wherein the first and the second heavily P-type doped regions with the bended portions of the first and the third gate lines, the first and the second P-well lines, and N-type source/drain regions of the first and the third N-type MOS transistors, respectively, form a first gated diode and a second gated diode to a ground terminal.

In an embodiment, the invention provides a semiconductor device, having a 6T SRAM cell formed on a substrate. The SRAM cell comprises a first inverter and a second inverter, coupled in parallel but in reverse direction between a first node and a second node, the first inverter having a first P-type metal-oxide-semiconductor (MOS) transistor and a first N-type MOS transistor, the second inverter having a second P-type MOS transistor and a second N-type MOS transistor. A first switch transistor, is connected to the first node. A second switch transistor is connected to the second node. A first, a second, a third, and a fourth gate lines, respectively connect gates of the first inverter, the first switch transistor, the second inverter, and the second switch transistor. The first gate line and the third gate line respectively relating to the first and the second N-type MOS transistors have bending portions at ends to form an L-like shape.

In an embodiment, as to the SRAM cell, the first gate line, the second gate line, the third gate line, and the fourth gate line over the substrate form a rectangle.

In an embodiment, as to the SRAM cell, the substrate is silicon substrate.

In an embodiment, as to the SRAM cell, the substrate is a silicon on insulator (SOI) substrate, comprising a top silicon layer for forming a N-well line, a first P-well line and a second P-well line.

In an embodiment, as to the SRAM cell, the first P-type MOS transistor and the second P-type MOS transistor are grouped to one and distributing along a N-well line in the substrate.

In an embodiment, as to the SRAM cell, the first switch transistor and the first N-type MOS transistor of the first inverter are grouped to one distributing along a first P-well line in the substrate, wherein the second switch transistor and the second N-type MOS transistor of the second inverter are grouped to one distributing along a second P-well line in the substrate.

In an embodiment, as to the SRAM cell, a plurality of the SRAM cells is formed along the N-well line, the first P-well line, and the second P-well line.

In an embodiment, as to the SRAM cell, a plurality of the N-well lines, a plurality of the first P-well lines, and a plurality of the second P-well lines are extending in parallel, to form a SRAM cell array.

In an embodiment, as to the SRAM cell, it further comprises a gate insulating layer at least between the first to the fourth gate lines and the substrate respectively within the first and the second P-type MOS transistors, the first to the second N-type MOS transistors, and the first and the second switch transistors.

In an embodiment, as to the SRAM cell, it further comprises a first and a second heavily P-type doped regions in the substrate respectively along outsides of bended portions of the first and the third gate lines, wherein the first and the second heavily P-type doped regions with the bended portions of the first and the third gate lines, the first and the second P-well lines, and N-type source/drain regions of the first and the second N-type MOS transistors, respectively, form a first gated diode and a second gated diode to a ground terminal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
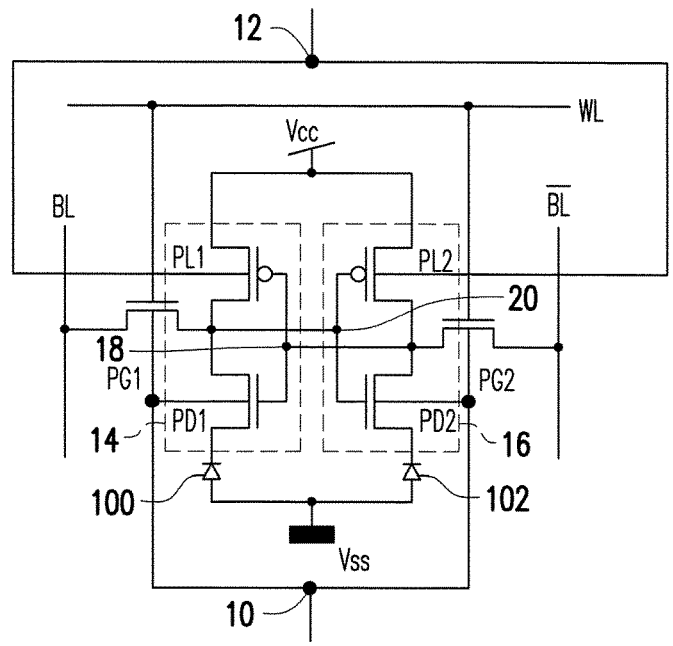
FIG. 1 is a drawing, schematically illustrating a circuit of 6T SRAM device, according to an embodiment of the invention.

The invention is described in detail by reference to exemplary embodiments with drawings. The same reference number in the drawings and descriptions represent the same or like device elements.

The invention proposes an improvement technology on the six transistors of the SRAM device in semiconductor structure.

The invention provides multiple embodiments for description, but the invention is not limited to the embodiments as provided.

FIG. 1 is a drawing, schematically illustrating a circuit of 6T SRAM device, according to an embodiment of the invention. Referring to FIG. 1, the basic circuit of the SRAM device is basically formed by 6 transistors. These 6 transistors usually represented by 6T, which is formed including two PMOS transistor PL1, PL2 and four NMOS transistors to have the basic structure. If it is needed, the read port circuit or other additional circuit can be further added, and then the circuit formed from 8T or 10T can be obtained. However, those circuits are still based on 6T circuit.

The PMOS transistor PL1 and the NMOS transistor PD1 can form an inverter 14. Likewise, the PMOS transistor PL2 and the NMOS transistor PD2 can form another inverter 16. The inverter 14 and the inverter 16 connected between two nodes 18 and 20 in parallel but reverse direction. Another two NMOS transistors PG1, PG2 can serve as the switch transistors. In circuit, the substrates of the NMOS transistors and the PMOS transistors need to be applied with the substrate voltage. The substrates of the NMOS transistors PD1, PD2, PG1, PG2 are provided with the corresponding substrate voltage through the node 10. The substrates of the PMOS transistors PL1, PL2 are provided with the corresponding substrate voltage through the node 12. The switch function of the NMOS transistor PG1, PG2 is done by controlling the gates through the word line (WL). The bit line (BL) and the complementary bit line (BL) provide the operation voltages through the conduction of the NMOS transistor PG1, PG2.

Further, the invention also adds the gated diodes 100, 102 between the NMOS transistors PD1, PD2 and the ground voltage VSS. The action of the gated diodes can further effectively lead out the accumulated charges in the transistors at the edge region of the cell array, and then reduce the operation performance shift as expected from the design.

Figure 2:
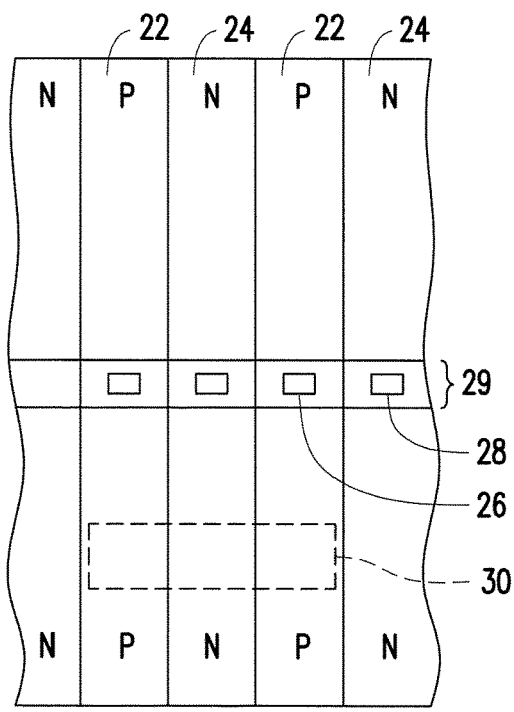
FIG. 2 is a drawing, schematically illustrating a layout of semiconductor structure on the substrate for 6T SRAM device, according to an embodiment of the invention.

In fabrication technology, the circuit in FIG. 1 can be fabricated on the substrate by use of the semiconductor fabrication technology. FIG. 2 is a drawing, schematically illustrating a layout of semiconductor structure on the substrate for 6T SRAM device, according to an embodiment of the invention.

Referring to FIG. 1 and FIG. 2, since the substrate voltages for the NMOS transistor and the PMOS transistor are different, the difference in semiconductor structures includes that the NMOS transistor is formed on the P-type substrate and the PMOS transistor is formed on the N-type substrate. Therefore, the two PMOS transistors PL1, PL2 are configured to be disposed on the same N-well line 24. The NMOS transistor PD1 and the NMOS transistor PG1 are configured to one group, disposed on the same P-well line 22, located at one side of the N-well line 24. The NMOS transistor PD2 and the NMOS transistor PG2 are also configured to another group, disposed on the same P-well line 22, located at another side of the N-well line 24.

In other words, one SRAM cell 30 would cross over the P-well line 22, the N-well line 24, and P-well line 22.

Multiple memory cells are disposed on the well lines along the longitudinal direction of the lines. These SRAM cells 30 form a cell array. On well line generally has a terminal 26, 28 at the middle region 29 of the cell array, so to respectively provide the substrate voltage to the well line.

However, the distance from the middle region 29 of the cell array to the edge region is rather long. The substrate of the transistor at far end is quite possibly accumulating charges, causing the reduce of the threshold voltage Vt, and then resulting in operation instability or leakage current. This phenomenon is more obvious to the transistors formed on the SOI substrate.

Figure 3:
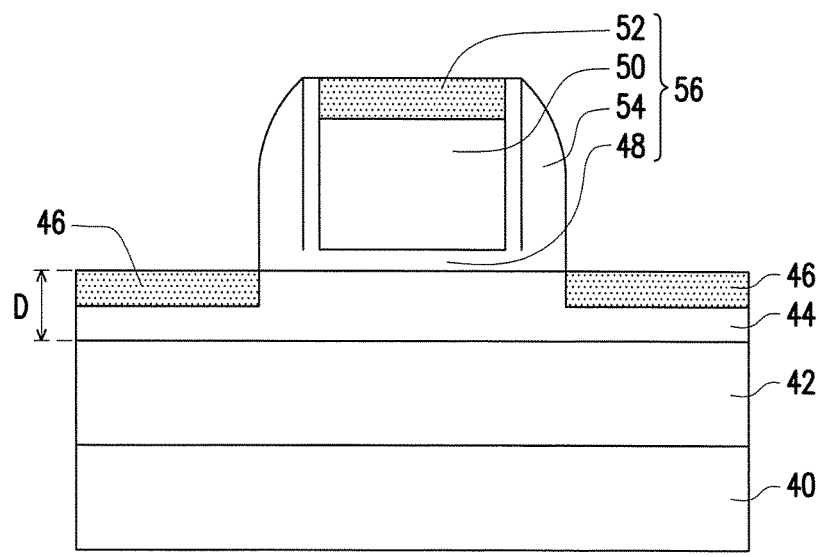
FIG. 3 is a drawing, schematically illustrating a layout of semiconductor structure on a SOI substrate for 6T SRAM device, according to an embodiment of the invention.

FIG. 3 is a drawing, schematically illustrating a layout of semiconductor structure on a SOI substrate for 6T SRAM device, according to an embodiment of the invention. Referring to FIG. 3, the SOI substrate includes an insulating layer 42 formed on a silicon substrate 40, and then the top silicon layer 44 is further formed. The top silicon layer 44 is a thin layer with a thickness about 200 microns in an example, but not limited to. The source/drain region 46 is formed in the top silicon layer 44 at both sides of the gate structure 56. Since the top silicon layer 44 is a thin layer and serves as the well line to provide the substrate voltage to the transistor, the threshold voltage Vt is very easily influenced by the accumulated charges in the insulating layer 42 thereunder. This influence is more obvious for the transistors located at the edge in the far end.

The gate structure 56 here, as usually known for an example, includes gate insulating layer 48, the polysilicon gate 50, the cap layer 52, the spacer 54 and so on. The invention is not just limited to the specific gate structure 56.

Figure 4:
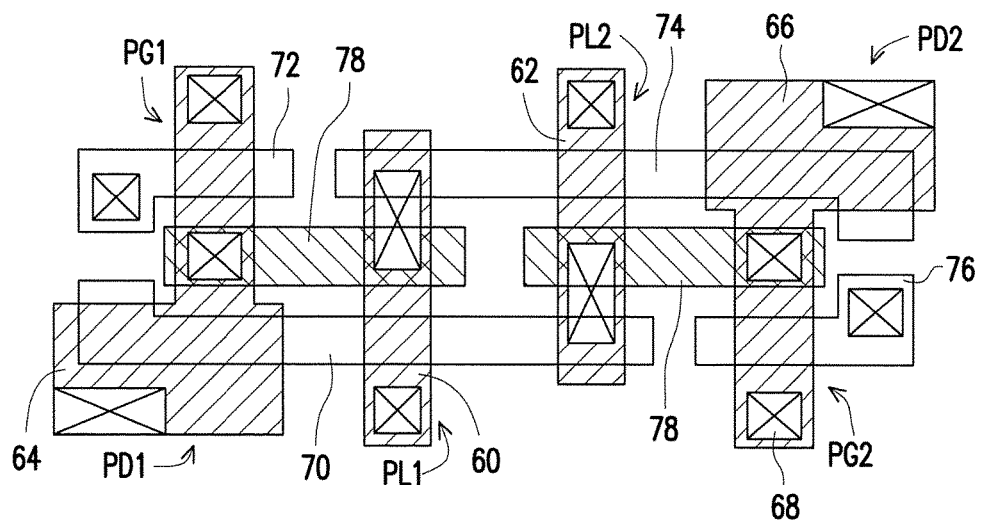
FIG. 4 is a drawing, schematically illustrating a top view of layout for 6T SRAM device, according to an embodiment of the invention.

The invention has looked into the possible issues and proposed the design for the semiconductor structure of memory cell. The issue about the operation shift of the transistor at the far end can be at least reduced. FIG. 4 is a drawing, schematically illustrating a top view of layout for 6T SRAM device, according to an embodiment of the invention.

Referring to FIG. 4, as to the layout of the 6T SRAM device, the PMOS transistors PL1, P12 are arranged at the middle region, locating over the N-well line 24, respectively having the P-doped active regions 60, 62, so to provide the source/drain regions at both side of the gate lines 70, 74. The NMOS transistor PD1 and NMOS transistor PG1 are grouped into one group, formed over one P-well line 22. The N-doped active region 64 provides the source/drain regions, located at both sides of the gate line 70 and the gate line 72, which are connected through the source/drain regions. Likewise, the N-doped active region 66 provides the source/drain regions, located at both sides of the gate line 74 and the gate line 76. The gates of the transistor PD1 and transistor PG1 are respectively provided from the gate line 70 and the gate line 72. The gates of the transistor PD2 and transistor PG2 are respectively provided from the gate line 74 and the gate line 76. The gate line 70 also provides the gate of the transistor PL1, so to connect with the gate of the transistor PD1 through the gate line 70. In addition, the gate line 70 is also connected to the source/drain region of the transistor PL2. The N-type transistor PD2 and transistor PG2 are grouped into another group, disposed over one P-well line 33, located at one side of the N-well line 24. Since the symmetric property of the circuit, the connection of the gate line 74 is similar to the gate line 70, the connection of the gate line 76 is similar to the gate line 72. In addition, the inter connection 78 connects the transistor PL1 to the transistor PG1 and the transistor PD1 through the contact plug 68. Likewise, the inter connection 78 connects the transistor PL2 to the transistor PG2 and the transistor PD2 through the contact plug 68.

Here, the invention provides the gate lines 70, 74, having the bending portion at the end, to form the L-like structure, so to at least reduce the issue about charge accumulation. Thus, the transistor at the far end can maintain the operation performed as expected according to design.

Further, the gate lines 72 and 76 are receiving the voltages from the word line (WL) to control whether or not the transistors PG1, PG2 are conducted or not. The gate lines 72, 76 can also be L-like shape. As a result, the four gate lines 70, 72, 74 and 76 form a rectangle, in which the bending portion at end can provide longer gate, and can increase the effective range of the source/drain region, so that the accumulating charges can be effectively excluded.

Figure 5:
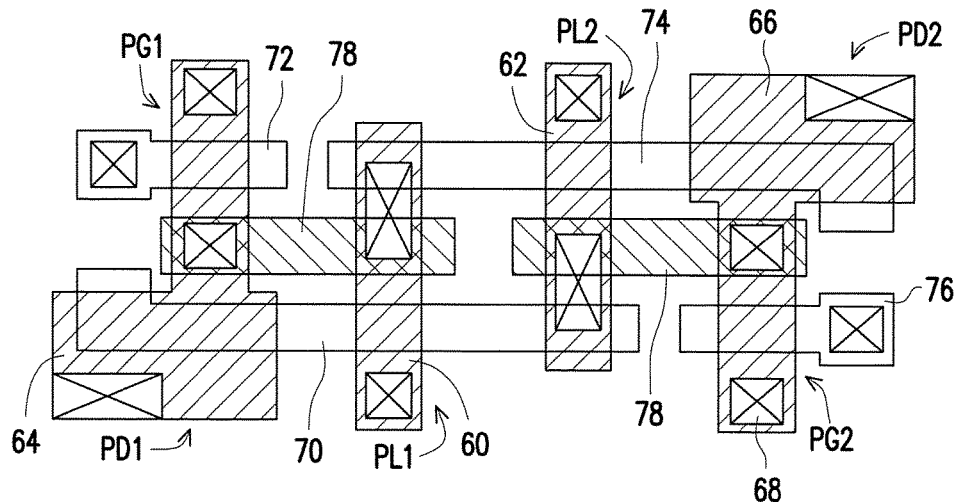
FIG. 5 is a drawing, schematically illustrating a top view of layout for 6T SRAM device, according to an embodiment of the invention.

With the similar effect, the four gate lines 70, 72, 74, 76 as shown in FIG. 4 are not the only choice and can have other modifications. FIG. 5 is a drawing, schematically illustrating a top view of layout for 6T SRAM device, according to an embodiment of the invention.

Referring to FIG. 5, the gate line 70 and the gate line 74 maintain the L-like shape, but the gate line 72 and the gate line 76 can be line shape or about line shape, without the L-like shape. However, the four gate lines 70, 72, 74, and 76 can still form a rectangle as a feature.

As to the further descriptions, the L-like shape is referring to the bending shape, and about the line shape as referred is allowing a slight transverse shift due to the circuit layout. The middle region of the gate line can be shifted as a step bending to have the transverse shift. However, the gate line 70 and the gate line 74 are bent at the end region into L-like shape.

Figure 6:
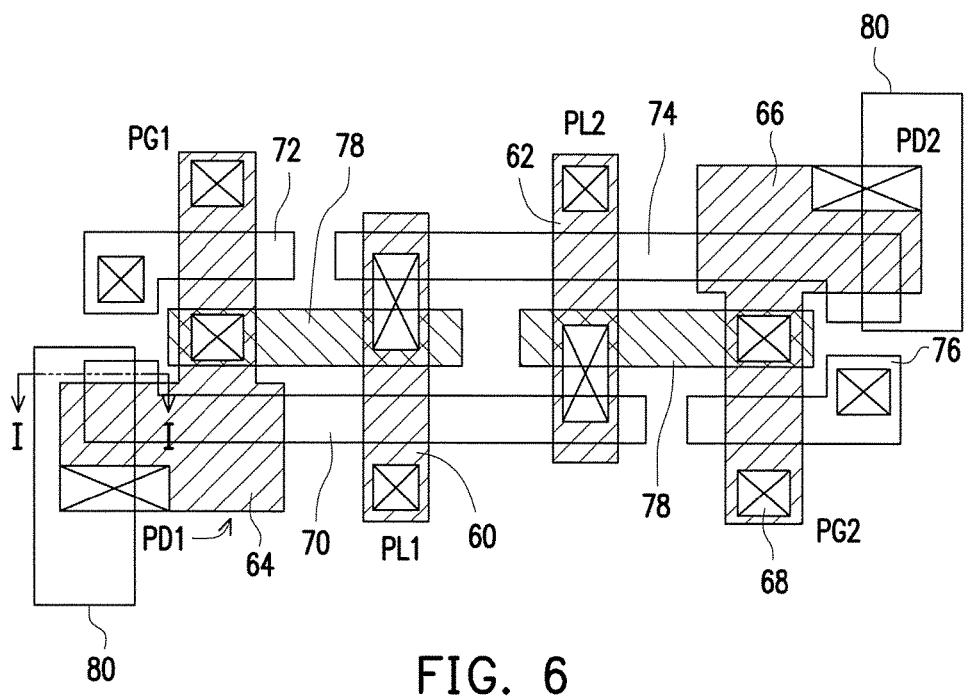
FIG. 6 is a drawing, schematically illustrating a top view of layout for 6T SRAM device, according to an embodiment of the invention.
Figure 7:
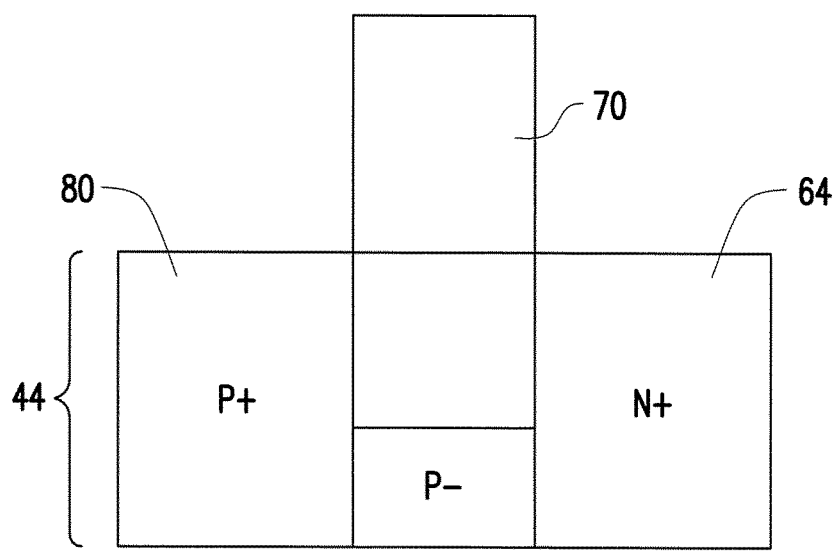
FIG. 7 is a drawing, schematically illustrating a cross-sectional structure for the gated diode device of the 6T SRAM device, according to an embodiment of the invention.

FIG. 6 is a drawing, schematically illustrating a top view of layout for 6T SRAM device, according to an embodiment of the invention. FIG. 7 is a drawing, schematically illustrating a cross-sectional structure for the gated diode device of the 6T SRAM device, according to an embodiment of the invention. Referring to FIG. 6 and also the cross-section structure in FIG. 7 at the cutting line I-I, it is the design for the gated diode 100, 102. The gated diode 100, 102 us connected in reverse direction, so the P side is connected to the low voltage VSS of the circuit, equivalent to the ground voltage. The gated diodes 100, 102 are to connect to the transistor PD1, PD2, and can have the P+ region 80 at the outer region of the active region 64 and the outer region of the bending portion of the gate lines 70 and 74, by heavily doping the top silicon layer 44 in FIG. 2. Here, the P+ represents heavily doped. The P-doped region under the gate line 70 represents lightly doping region for the well line. So, the active region 64 as N-type doped. In other words, a reverse connection for the gated diode is formed from the source/drain region to the P+ doped region 80.

The invention proposes the structure of the 6T SRAM device. The gate line 70 and the gate line 74 of the four gate lines 70, 72, 74, and 76 are added with a bending portion at the end part, so to form the L-like shape. Another two gate lines 72 and 76 can be line or L-like shape. The four gate lines 70, 72, 74, and 76 can enclosing a rectangle. In addition, the bending portions of the gate line 70 and the gate line 74 can be further implemented with gated diodes, so to further reduce the shift of operation performance between the transistors at the near end and the transistors at the far end.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, having a 6-transistor (6T) static random access memory (SRAM) cell formed on a substrate, the SRAM cell comprising:
   a first and a second P-type metal-oxide-semiconductor (MOS) transistors, formed over an N-well line in a substrate;
   a first and a second N-type MOS transistors, formed over a first P-well line in the substrate at a first side of the N-well line;
   a third and a fourth N-type MOS transistors, formed over a second P-well line in the substrate at a second side of the N-well line;
   a first gate line, connecting gates of the first P-type MOS transistor and the first N-type MOS transistor;
   a second gate line, connecting a gate of the second N-type MOS transistor;
   a third gate line, connecting gates of the second P-type MOS transistor and the third N-type MOS transistor; and
   a fourth gate line, connecting a gate of the fourth NMOS transistor,
   wherein the first gate line and the third gate line are in L-like shape.

2. The semiconductor device of claim 1, wherein the first gate line, the second gate line, the third gate line, and the fourth gate line over the substrate form a rectangle.

3. The semiconductor device of claim 1, wherein the second gate line and the fourth gate line are L-like shape or line shape.

4. The semiconductor device of claim 1, wherein the substrate is silicon substrate.

5. The semiconductor device of claim 1, wherein the substrate is a silicon on insulator (SOI) substrate, comprising a top silicon layer for forming the N-well line, the first P-well line and the second P-well line.

6. The semiconductor device of claim 1, wherein the first P-type MOS transistor and the first N-type MOS transistor form a first inverter, and the second P-type MOS transistor and the third N-type MOS transistor form a second inverter.

7. The semiconductor device of claim 6, wherein the second N-type MOS transistor and the fourth N-type MOS serve as switch devices.

8. The semiconductor device of claim 1, wherein a plurality of the SRAM cells are formed along the N-well line, the first P-well line, and the second P-well line.

9. The semiconductor device of claim 8, wherein a plurality of the N-well lines, a plurality of the first P-well lines, and a plurality of the second P-well lines are extending in parallel, to form a SRAM cell array.

10. The semiconductor device of claim 1, further comprising a gate insulating layer at least between the first to the fourth gate lines and the substrate respectively within the first and the second P-type MOS transistors and the first to the fourth N-type MOS transistors.

11. The semiconductor device of claim 1, further comprising a first and a second heavily P-type doped regions in the substrate respectively along outsides of bended portions of the first and the third gate lines, wherein the first and the second heavily P-type doped regions with the bended portions of the first and the third gate lines, the first and the second P-well lines, and N-type source/drain regions of the first and the third N-type MOS transistors, respectively, form a first gated diode and a second gated diode to a ground terminal.

12. A semiconductor device, having a 6-transistor (6T) static random access memory (SRAM) cell formed on a substrate, the SRAM cell comprising:
    a first inverter and a second inverter, coupled in parallel but in reverse direction between a first node and a second node, the first inverter having a first P-type metal-oxide-semiconductor (MOS) transistor and a first N-type MOS transistor, the second inverter having a second P-type MOS transistor and a second N-type MOS transistor;
    a first switch transistor, connected to the first node;
    a second switch transistor, connected to the second node; and
    a first, a second, a third, and a fourth gate lines, respectively connecting gates of the first inverter, the first switch transistor, the second inverter, and the second switch transistor,
    wherein the first gate line and the third gate line respectively relating to the first and the second N-type MOS transistors have bending portions at ends to form an L-like shape.

13. The semiconductor device of claim 12, wherein the first gate line, the second gate line, the third gate line, and the fourth gate line over the substrate form a rectangle.

14. The semiconductor device of claim 12, wherein the substrate is silicon substrate.

15. The semiconductor device of claim 12, wherein the substrate is a silicon on insulator (SOI) substrate, comprising a top silicon layer for forming a N-well line, a first P-well line and a second P-well line.

16. The semiconductor device of claim 12, wherein the first P-type MOS transistor and the second P-type MOS transistor are grouped to one and distributing along a N-well line in the substrate.

17. The semiconductor device of claim 16, wherein the first switch transistor and the first N-type MOS transistor of the first inverter are grouped to one distributing along a first P-well line in the substrate, wherein the second switch transistor and the second N-type MOS transistor of the second inverter are grouped to one distributing along a second P-well line in the substrate.

18. The semiconductor device of claim 17, wherein a plurality of the SRAM cells is formed along the N-well line, the first P-well line, and the second P-well line.

19. The semiconductor device of claim 18, wherein a plurality of the N-well lines, a plurality of the first P-well lines, and a plurality of the second P-well lines are extending in parallel, to form a SRAM cell array.

20. The semiconductor device of claim 13, further comprising a gate insulating layer at least between the first to the fourth gate lines and the substrate respectively within the first and the second P-type MOS transistors, the first to the second N-type MOS transistors, and the first and the second switch transistors.

21. The semiconductor device of claim 17, further comprising a first and a second heavily P-type doped regions in the substrate respectively along outsides of bended portions of the first and the third gate lines, wherein the first and the second heavily P-type doped regions with the bended portions of the first and the third gate lines, the first and the second P-well lines, and N-type source/drain regions of the first and the second N-type MOS transistors, respectively, form a first gated diode and a second gated diode to a ground terminal.

\* \* \* \* \*